(12) United States Patent
Li et al.

(10) Patent No.: US 12,463,597 B2
(45) Date of Patent: Nov. 4, 2025

(54) RADIO-FREQUENCY POWER AMPLIFIER, RADIO-FREQUENCY FRONT-END MODULE AND COMMUNICATION TERMINAL

(71) Applicant: VANCHIP (TIANJIN) TECHNOLOGY CO., LTD., Tianjin (CN)

(72) Inventors: Hao Li, Tianjin (CN); Yunfang Bai, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 521 days.

(21) Appl. No.: 18/061,480

(22) Filed: Dec. 5, 2022

(65) Prior Publication Data
US 2023/0098158 A1 Mar. 30, 2023

Related U.S. Application Data

(63) Continuation of application No. PCT/CN2021/097884, filed on Jun. 2, 2021.

(30) Foreign Application Priority Data

Jun. 3, 2020 (CN) .......................... 202010492691.7

(51) Int. Cl.
*H03G 3/30* (2006.01)
*H03F 1/32* (2006.01)
*H03F 1/56* (2006.01)
*H03F 3/24* (2006.01)

(52) U.S. Cl.
CPC ............... *H03F 1/32* (2013.01); *H03F 1/565* (2013.01); *H03F 3/245* (2013.01); *H03F 2200/222* (2013.01); *H03F 2200/451* (2013.01)

(58) Field of Classification Search
CPC .................................. H03G 3/30; H03F 3/191
USPC .................................................. 330/279, 302
See application file for complete search history.

*Primary Examiner* — Henry Choe
(74) *Attorney, Agent, or Firm* — George Guosheng Wang; Upstream Research and Patent LLC

(57) ABSTRACT

Disclosed are a radio-frequency power amplifier, a radio-frequency front-end module and a communication terminal. The radio-frequency power amplifier includes a control unit, a power amplification unit, a detection unit and an input matching unit. In the radio-frequency power amplifier, the detection unit detects an index parameter related to the output power of the power amplification unit in real time, converts the index parameter into a voltage positively correlated to the magnitude of the index parameter, and outputs the voltage to the input matching unit, such that a phase change of a radio-frequency signal input into the power amplification unit is the opposite of a phase change generated by an output signal of the power amplification unit, thereby effectively realizing the compensation of phase distortion of radio-frequency signals output by the power amplification unit in different modes, and improving a linearity index of the radio-frequency front-end module.

20 Claims, 10 Drawing Sheets

The detection unit detects an index parameter related to the output power of the power amplification unit in real time The detection unit converts the index parameter into a voltage positively correlated to the magnitude of the index parameter The detection unit outputs the converted voltage to the input matching unit, so as to adjust the phase of a radio-frequency signal input into the power amplification unit

FIG. 2

RADIO-FREQUENCY POWER AMPLIFIER, RADIO-FREQUENCY FRONT-END MODULE AND COMMUNICATION TERMINAL

BACKGROUND

Technical Field

The present invention relates to a radio-frequency power amplifier, and also relates to a radio-frequency front-end module including the radio-frequency power amplifier and a corresponding communication terminal, which belong to the technical field of wireless communications.

RELATED ART

With the progress of science and technology, the Wifi communication standard has experienced IEEE 802.11-1997, IEEE 802.11a, 802.11b, 802.11g, 802.11n, and 802.11ac to IEEE 802.11ax. Also, the mobile communication technology has experienced 2G and 3G, the 4G mobile communication technology is being widely applied, and the 5G mobile communication technology will be actively deployed in the future. A radio-frequency front-end linearity is highly required for the development of Wifi communications and mobile communications. Therefore, there is a need for manufacturers of communication devices to design communication apparatuses with high linearity.

A radio-frequency front-end module is an important radio-frequency component which cannot be integrated by a transceiver in a current wireless communication terminal. In the radio-frequency front-end module, a modulated radio-frequency signal is amplified to a certain power value by a power amplifier, and then the amplified radio-frequency signal is transmitted out by an antenna.

However, in the process of amplifying the power of a radio-frequency signal by a power amplifier of a conventional radio-frequency front-end module, with the increase of the output power, an operating point of the power amplifier will be changed due to the influence of high power, such that an operating state of the power amplifier will be changed, thereby changing the characteristics of the power amplifier. The phase of the radio-frequency signal including different output powers will be changed, thereby affecting a linearity index of the radio-frequency front-end module.

SUMMARY

The primary technical problem to be solved by the present invention is to provide a radio-frequency power amplifier.

Another technical problem to be solved by the present invention is to provide a radio-frequency front-end module including the above-mentioned radio-frequency power amplifier and a corresponding communication terminal.

In order to achieve the above objective, the present invention adopts the following technical solution.

According to a first aspect of an embodiment of the present invention, there is provided a radio-frequency power amplifier including a power amplification unit, a detection unit and an input matching unit. An output end of the power amplification unit is connected to an input end of the detection unit, an output end of the detection unit is connected to an input end of the input matching unit, and an output end of the input matching unit is connected to an input end of the power amplification unit.

The detection unit detects an index parameter related to the output power of the power amplification unit in real time, converts the index parameter into a voltage positively correlated to the magnitude of the index parameter, and outputs the voltage to the input matching unit, such that a phase change of a radio-frequency signal input into the power amplification unit is the opposite of a phase change generated by an output signal of the power amplification unit.

According to a second aspect of an embodiment of the present invention, there is provided a radio-frequency power amplifier including a power amplification unit, a detection unit and an input matching unit. A bias end of the power amplification unit is connected to an input end of the detection unit, an output end of the detection unit is connected to an input end of the input matching unit, and an output end of the input matching unit is connected to an input end of the power amplification unit.

The detection unit detects an index parameter related to the output power of the power amplification unit in real time, converts the index parameter into a voltage positively correlated to the magnitude of the index parameter, and outputs the voltage to the input matching unit, such that a phase change of a radio-frequency signal input into the power amplification unit is the opposite of a phase change generated by an output signal of the power amplification unit.

Preferably, the index parameter is the output power or operating current of the power amplification unit.

Preferably, the radio-frequency power amplifier further includes a control unit and a power supply unit. An output end of the control unit is connected to the input end of the power amplification unit and an input end of the power supply unit respectively, and an output end of the power supply unit is connected to power supply ends of the power amplification unit and the detection unit respectively.

Preferably, the power amplification unit includes at least one stage of amplification circuit, each stage of amplification circuit is connected to a bias circuit respectively, and an output end of a certain stage of amplification circuit is connected to the input end of the power detection unit.

Preferably, if the power amplification unit includes two or more stages of amplification circuits, the various stages of amplification circuits are connected through an inter-stage matching circuit, an input end of the first stage of amplification circuit is connected to the output end of the input matching unit, and the last stage of amplification circuit is impedance-matched with an external antenna through an output matching circuit.

Preferably, the detection unit uses a power detection module, an input end of the power detection module is connected to an output end of a certain stage of amplification circuit of the power amplification unit, and an output end of the power detection module is connected to the input end of the input matching unit.

Preferably, the detection unit uses a current acquisition circuit and a bias voltage generation circuit, an input end of the current acquisition circuit is connected to a bias circuit connected to a certain stage of amplification circuit, an output end of the current acquisition circuit is connected to an input end of the bias voltage generation circuit, and an output end of the bias voltage generation circuit is connected to the input end of the input matching unit.

Preferably, the input matching unit includes at least one first LC matching circuit, an input end of each of the first LC matching circuits is connected to the output end of the detection unit, and an output end of the last first LC matching circuit is connected to the input end of the power amplification unit.

Preferably, the input matching unit includes at least one second LC matching circuit, an input end of each of the second LC matching circuits is connected to the output end of the detection unit, and an output end of the last second LC matching circuit is connected to the input end of the power amplification unit.

Preferably, the input matching unit includes at least one first LC matching circuit and at least one second LC matching circuit, input ends of each of the first LC matching circuits and each of the second LC matching circuits are connected to the output end of the detection unit respectively, and output ends of the last first LC matching circuit and the last second LC matching circuit are connected to the input end of the power amplification unit respectively.

Preferably, each of the first LC matching circuits is composed of a first inductor grounded in parallel and a first voltage-controlled capacitor connected in series, a non-grounded end of the first voltage-controlled capacitor is connected to the output end of the detection unit, and a non-grounded end of the first voltage-controlled capacitor of the last first LC matching circuit is also connected to the input end of the power amplification unit.

Preferably, each of the second LC matching circuits is composed of a second inductor connected in series and a second voltage-controlled capacitor grounded in parallel, a non-grounded end of the second voltage-controlled capacitor is connected to the output end of the detection unit, and a non-grounded end of the second voltage-controlled capacitor of the last second LC matching circuit is also connected to the input end of the power amplification unit.

According to a third aspect of an embodiment of the present invention, there is provided a radio-frequency front-end module including the above-mentioned radio-frequency power amplifier.

According to a fourth aspect of an embodiment of the present invention, there is provided a communication terminal including the above-mentioned radio-frequency power amplifier.

In the radio-frequency power amplifier provided by the present invention, the control unit changes a function relationship between the output power of the power amplification unit and the output voltage of the detection unit in different frequency bands and different power level modes, and the detection unit converts the detected output power or operating current of the power amplification unit into a corresponding voltage, and then inputs the voltage into the input matching unit, such that a phase change of a radio-frequency signal input into the power amplification unit is the opposite of a phase change generated by an output signal of the power amplification unit, and the phase of a radio-frequency signal finally output by the power amplification unit is unchanged, thereby effectively realizing the compensation of phase distortion of radio-frequency signals output by the power amplification unit in different modes, and improving a linearity index of the radio-frequency front-end module.

BRIEF DESCRIPTION OF THE DRAWINGS

FIG. 2 is an operating principle flowchart of a radio-frequency power amplifier according to the present invention.

DETAILED DESCRIPTION

Technical contents of the present invention are further described in detail below with reference to the accompanying drawings and specific embodiments.

Figure 1:
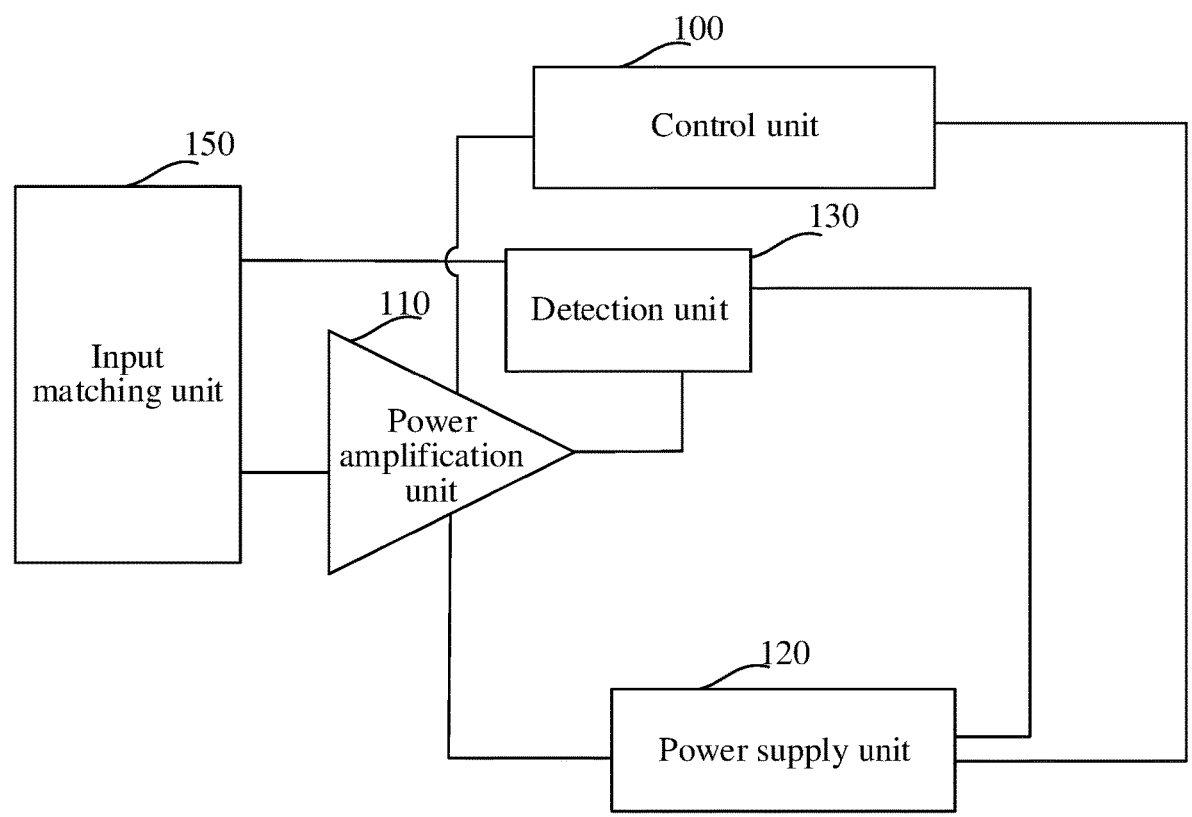
FIG. 1 is a schematic structural diagram of a radio-frequency power amplifier according to the present invention.

In order to solve the problem that the phase of a radio-frequency signal changes with the increase of the output power of a radio-frequency power amplifier caused thereby, as shown in FIG. 1, an embodiment of the present invention provides a newly-designed radio-frequency power amplifier, including a control unit 100, a power amplification unit 110, a power supply unit 120, a detection unit 130, and an input matching unit 150. An output end of the control unit 100 is connected to input ends of the power amplification unit 110 and the power supply unit 120 respectively. An output end or a bias end of the power amplification unit 110 is connected to an input end of the detection unit 130. An output end of the detection unit 130 is connected to an input end of the input matching unit 150. An output end of the input matching unit 150 is connected to the input end of the power amplification unit 110. Power supply ends of the power amplification unit 110 and the detection unit 130 are connected to an output end of the power supply unit 120 respectively.

As shown in FIG. 2, in the radio-frequency power amplifier, the detection unit 130 detects an index parameter related to the output power of the power amplification unit 110 in real time, converts the index parameter into a voltage positively correlated to the magnitude of the index parameter, and outputs the voltage to the input matching unit 150, so as to adjust the phase of a radio-frequency signal input into the power amplification unit 110. The index parameter related to the output power of the power amplification unit 110, which is detected by the detection unit 130 in real time, includes the output power or operating current of the power amplification unit 110.

Therefore, in the radio-frequency power amplifier, the detection unit 130 may convert the output power of the power amplification unit 110 detected in real time into a voltage positively correlated to the output power and then output the voltage to the input matching unit 150, such that a phase change of a radio-frequency signal input into the power amplification unit 110 is the opposite of a phase change generated by an output signal of the power amplification unit 110, the function of phase change cancellation is achieved, and the phase of a radio-frequency signal finally output by the power amplification unit 110 is unchanged, thereby realizing the compensation of phase distortion of radio-frequency signals output by the power amplification unit 110 in different modes, and improving a linearity index of the radio-frequency front-end module.

Alternatively, in the radio-frequency power amplifier, the detection unit 130 converts the operating current of the power amplification unit 110 detected in real time into a voltage positively correlated to the operating current and then inputs the voltage into the input matching unit 150, such that a phase change of a radio-frequency signal input into the power amplification unit 110 is the opposite of a phase change generated by an output signal of the power amplification unit 110, the effect of phase change cancellation is achieved, and the phase of a radio-frequency signal finally output by the power amplification unit 110 is unchanged, thereby realizing the compensation of phase distortion of radio-frequency signals output by the power amplification unit 110 in different modes, and improving a linearity index of the radio-frequency front-end module.

The control unit 100 may be implemented using a central processing unit in a communication terminal. The control unit 100 may control the operating state of the power supply unit 120, and the magnitudes of a power supply voltage and current generated and output during operation. A function relationship between the output power of the power amplification unit 110 and the output voltage of the detection unit 130 may also be changed in different frequency bands and different power level modes.

Figure 3:
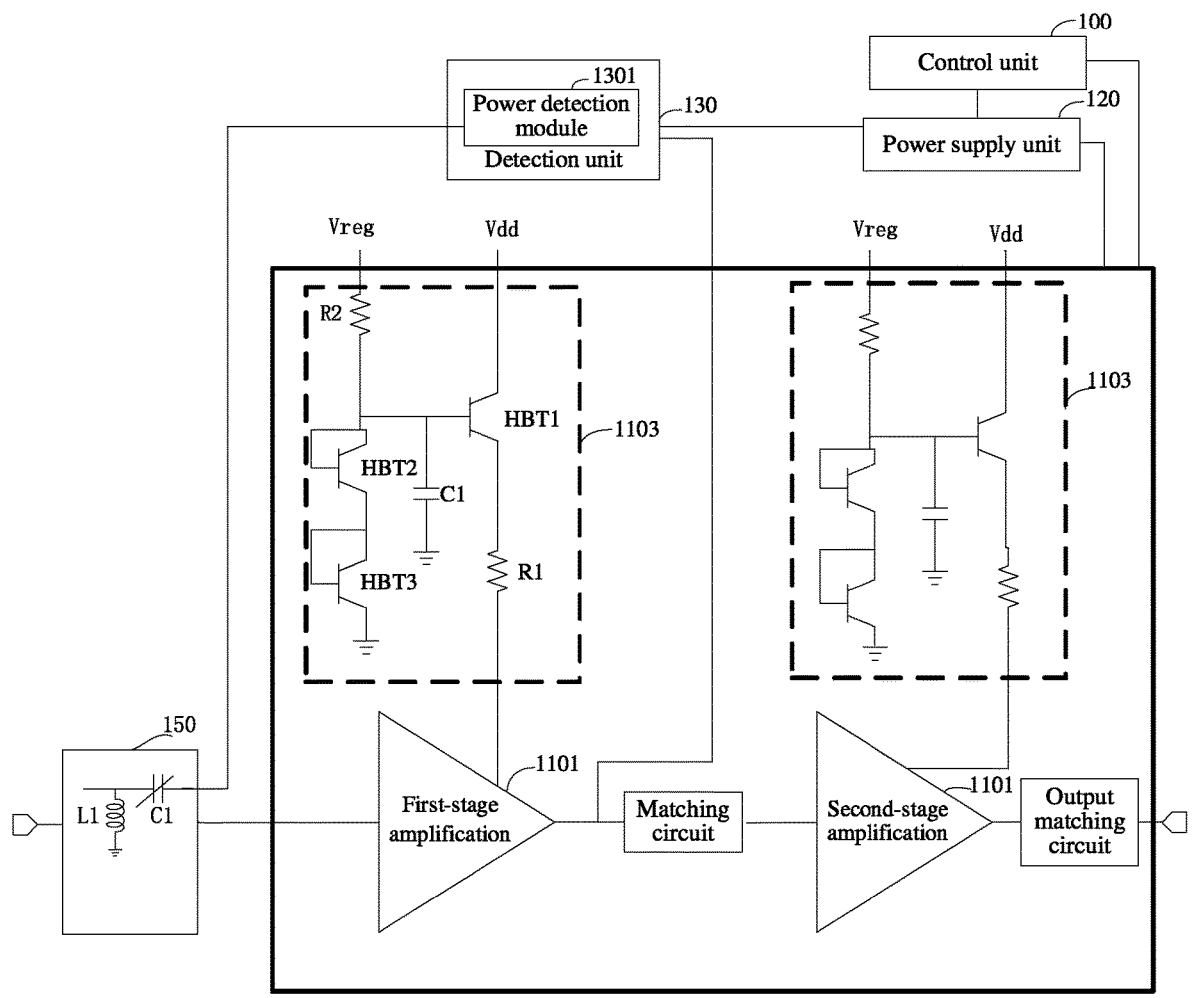
FIG. 3 is a schematic structural diagram of a first detection unit combined with a first input matching unit in a radio-frequency power amplifier according to the present invention.

The power amplification unit 110 is configured to amplify the modulated radio-frequency signal to a preset power value. The power amplification unit 110 includes at least one stage of amplification circuit. Each stage of amplification circuit is connected to a bias circuit respectively, and an output end of any stage of amplification circuit is connected to the input end of the power detection unit 130. If the power amplification unit 110 has only one stage of amplification circuit, an input end of this stage of amplification circuit is connected to the output end of the input matching unit 150, and this stage of amplification circuit is impedance-matched with an external antenna through an output matching circuit. If the power amplification unit 110 includes two or more stages of amplification circuits, the various stages of amplification circuits are connected through an inter-stage matching circuit, an input end of the first stage of amplification circuit is connected to the output end of the input matching unit 150, and the last stage of amplification circuit is impedance-matched with an external antenna through an output matching circuit. As shown in FIG. 3, the power amplification unit 110 includes, for example, two stages of amplification circuits 1101. The first stage of amplification circuit and the second stage of amplification circuit are connected through an inter-stage matching circuit, an input end of the first stage of amplification circuit is connected to the output end of the input matching unit 150, and the second stage of amplification circuit is impedance-matched with an external antenna through an output matching circuit. Each stage of amplification circuit 1101, the inter-stage matching circuit and the output matching circuit are conventional circuits and will not be described in detail herein.

The bias circuit is configured to provide a bias voltage and an operating current for the corresponding amplification circuit. As shown in FIG. 3, two stages of amplification circuits are included for example. The first stage of amplification circuit and the second stage of amplification circuit are connected to a bias circuit 1103 respectively. Each bias circuit 1103 includes a first transistor HBT1, a second transistor HBT2, a third transistor HBT3, a capacitor C1, a first resistor R1, and a second resistor R2. A connection relationship between various parts of the bias circuit 1103 is as follows. A collector of the first transistor HBT1 is connected to a power supply voltage Vdd. An emitter of the first transistor HBT1 is connected to a bias end of a corresponding amplification circuit through the first resistor R1. A base of the first transistor HBT1 is connected to one end of the capacitor C1, a collector of the second transistor HBT2 and one end of the second resistor R2 respectively. The other end of the capacitor C1 is grounded. The collector of the second transistor HBT2 is connected to a base thereof. The other end of the second resistor R2 is connected to a bias voltage Vreg. An emitter of the second transistor HBT2 is connected to a base and a collector of the third transistor HBT3. An emitter of the third transistor HBT3 is grounded.

The power supply unit 120 is configured to provide a required voltage and current for the power amplification unit 110 and the detection unit 130. The power supply unit 120 is implemented using a linear regulated power supply.

As shown in FIG. 3, in one embodiment of the present invention, the detection unit 130 uses a power detection module 1301, an input end of the power detection module 1301 is connected to an output end of a certain stage of amplification circuit of the power amplification unit 110, and an output end of the power detection module 1301 is connected to the input end of the input matching unit 150. The power detection module 1301 acquires the output power of a certain stage of amplification circuit of the power amplification unit 110 in real time, and converts the output power into a direct current voltage positively correlated to the magnitude of the output power. The power detection module 1301 may be implemented using a detector, such as a logarithmic detector, a mean detector or a peak detector.

Figure 4:
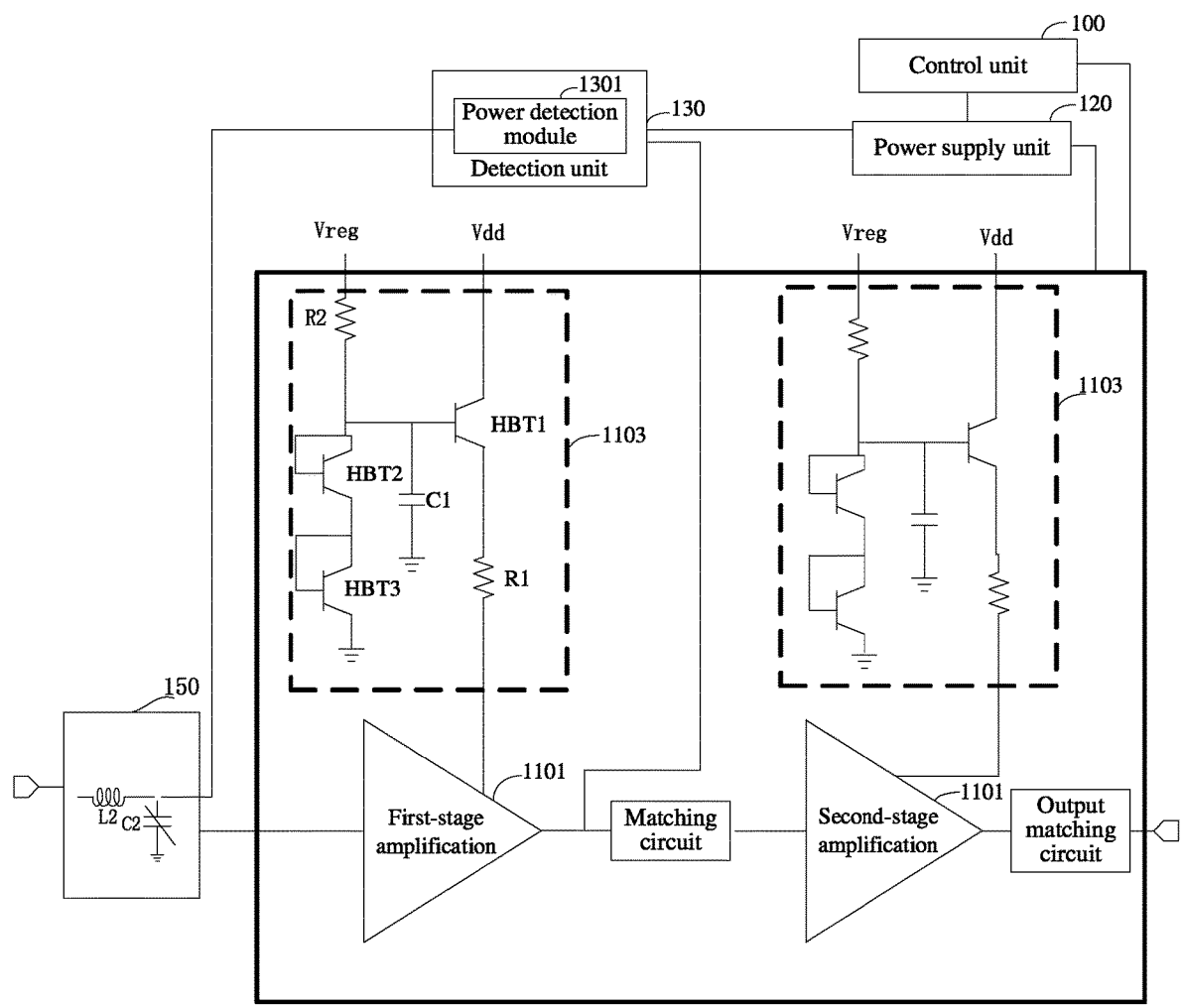
FIG. 4 is a schematic structural diagram of a second detection unit combined with a second input matching unit in a radio-frequency power amplifier according to the present invention.
Figure 5:
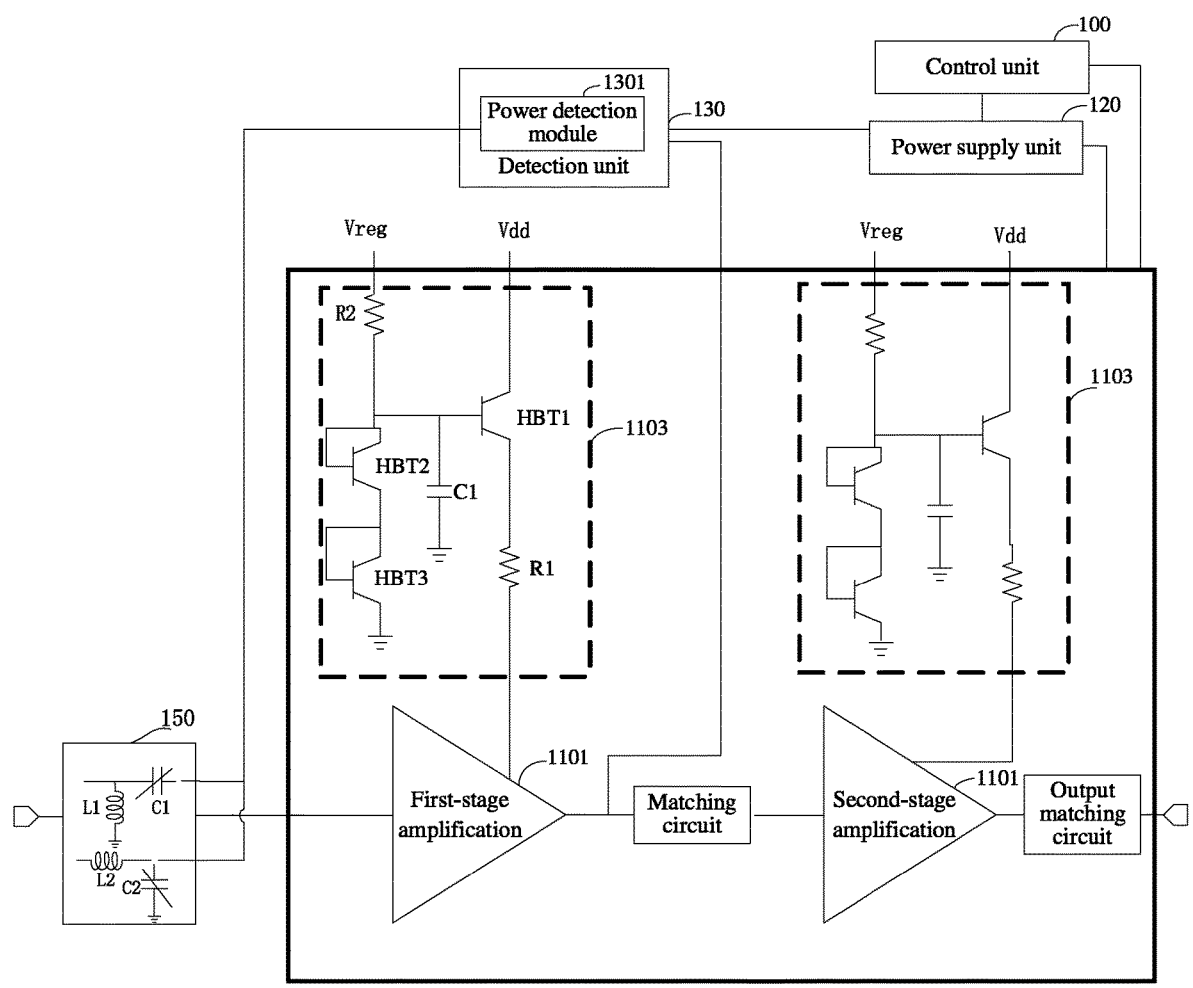
FIG. 5 is a schematic structural diagram of a third detection unit combined with a third input matching unit in a radio-frequency power amplifier according to the present invention.

As shown in FIGS. 3 to 5, the input matching unit 150 is configured for input matching of the power amplification unit 110, and also to cancel a phase change generated by the power amplification unit 110, thereby making the phase of a radio-frequency signal finally output by the power amplification unit 110 unchanged. The input matching unit 150 has various structural forms. Specifically, as shown in FIG. 3, the first input matching unit 150 includes at least one first LC matching circuit, an input end of each first LC matching circuit is connected to the output end of the power detection module 1301, and an output end of the last first LC matching circuit is connected to the input end of the power amplification unit 110. Each first LC matching circuit is composed of a first inductor L1 grounded in parallel and a first voltage-controlled capacitor C1 connected in series, and a non-grounded end of the first voltage-controlled capacitor C1 is connected to the output end of the power detection module 1301. And a non-grounded end of the first voltage-controlled capacitor C1 of the last first LC matching circuit is also connected to the input end of the power amplification unit 110. The number of first LC matching circuits is adjusted according to the frequency and bandwidth of a radio-frequency signal.

As shown in FIG. 3, in order to facilitate understanding of the embodiments of the present invention, the input matching unit 150 may include a first LC matching circuit composed of a first inductor L1 grounded in parallel and a first voltage-controlled capacitor C1 connected in series in an example where the radio-frequency signal has a low frequency and bandwidth. The first voltage-controlled capacitor C1 is implemented using a CMOS process, and has the operating characteristics that the magnitude of capacitance changes according to the voltage difference across the first voltage-controlled capacitor C1, thereby affecting a phase change of a radio-frequency signal passing through the input matching unit 150. The phase change of the radio-frequency signal is the opposite of a phase change of a radio-frequency signal caused by the power amplification unit 110. Therefore, the phase change generated by the power amplification unit 110 can be canceled, so as to make the phase of the radio-frequency signal finally output by the power amplification unit 110 unchanged.

Specifically, as the output power of the power amplification unit 110 gradually increases, the phase of the output radio-frequency signal is changed accordingly. In one case, as the output power of the power amplification unit 110 gradually increases, the phase of the radio-frequency signal output thereby gradually increases, i.e. the phase of the radio-frequency signal output by the power amplification unit 110 changes positively with the output power thereof. At this moment, the first voltage-controlled capacitor C1 is adjusted to be positively polar, such that the voltage difference across the first voltage-controlled capacitor C1 is positive, and the phase of the radio-frequency signal passing through the input matching unit 150 changes negatively with the voltage difference across the first voltage-controlled capacitor C1. Therefore, as the output power of the power amplification unit 110 gradually increases, the output voltage of the power detection module 1301 will gradually increase, and the output voltage controls the voltage at a positive end of the first voltage-controlled capacitor C1 in the input matching unit 150, while the voltage at a negative end of the first voltage-controlled capacitor C1 is zero (because the first inductor L1 is grounded). It would have been readily obtained from formula (1): under the frequency of a fixed radio-frequency signal, the voltage difference across the first voltage-controlled capacitor C1 increases with the increase of the output power of the power amplification unit 110, the capacitance of the first voltage-controlled capacitor C1 increases with the increase of the output power of the power amplification unit, and the phase of the radio-frequency signal passing through the input matching unit 150 decreases with the increase of the output power of the power amplification unit, i.e. the phase of the radio-frequency signal passing through the input matching unit 150 changes negatively with the output power of the power amplification unit. A phase change of the radio-frequency signal passing through the input matching unit 150 is the opposite of a phase change of a radio-frequency signal caused by the power amplification unit 110, and the phase change generated by the power amplification unit 110 can be canceled, so as to make the phase of the radio-frequency signal finally output by the power amplification unit 110 unchanged.

$$\theta = K*\arctan\left(\frac{1}{C1*2\pi f}\right) \quad (1)$$

where $\theta$ represents the phase of a radio-frequency signal passing through the input matching unit 150, K represents a scaling coefficient, C1 represents the first voltage-controlled capacitor, and f represents the frequency of the radio-frequency signal.

Figure 6A:
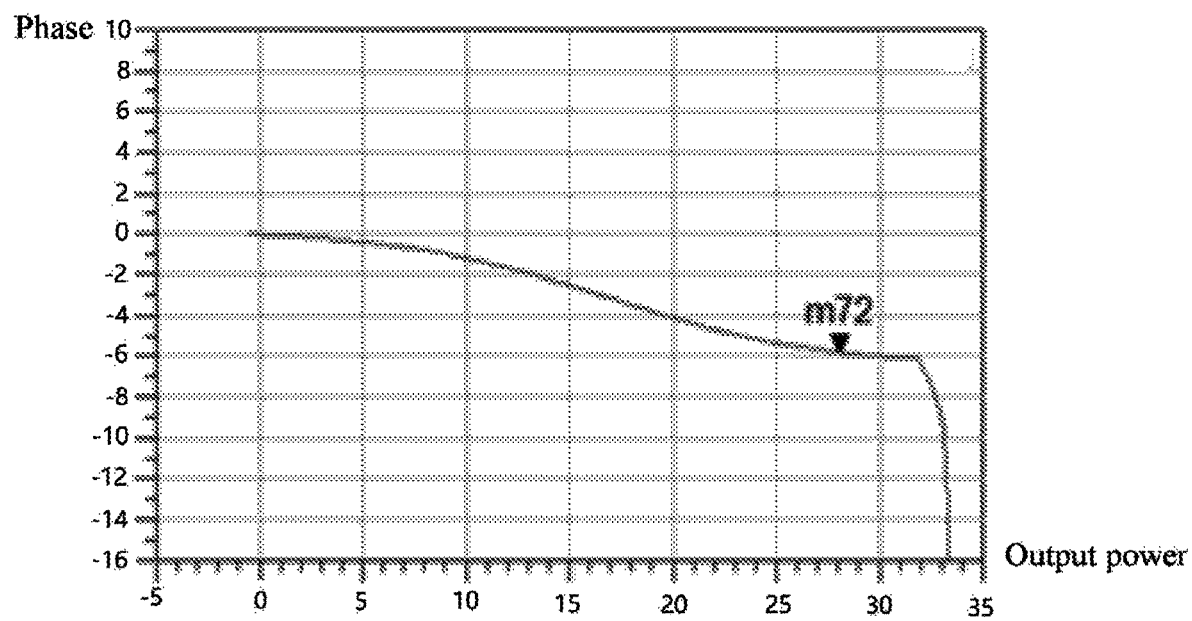
FIG. 6A is a schematic diagram of a change curve of the output power of a power amplification unit and the phase of a radio-frequency signal when a radio-frequency power amplifier according to the present invention is not used.
Figure 6B:
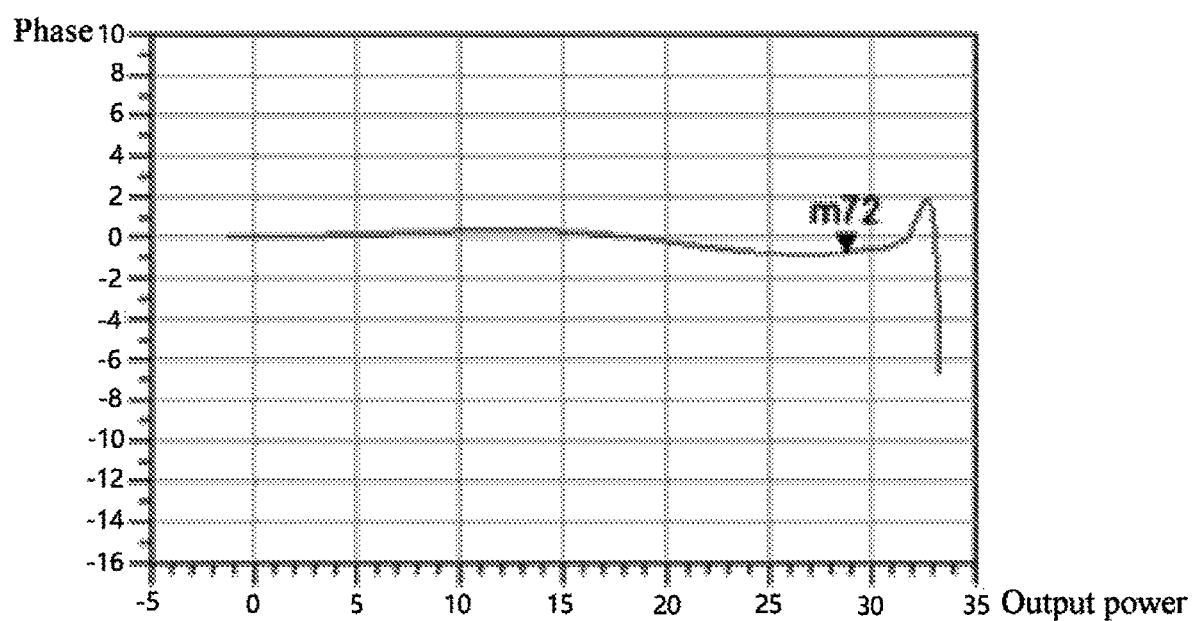
FIG. 6B is a schematic diagram of a change curve of the output power of a power amplification unit and the phase of a radio-frequency signal when a radio-frequency power amplifier according to the present invention is used.

In another case, as shown in FIG. 6A, as the output power of the power amplification unit 110 gradually increases, the phase of the radio-frequency signal output thereby may gradually decrease, i.e. the phase of the radio-frequency signal output by the power amplification unit 110 changes negatively with the output power thereof. At this moment, the first voltage-controlled capacitor C1 is adjusted to be negatively polar, such that the voltage difference across the first voltage-controlled capacitor C1 is negative, and the phase of the radio-frequency signal passing through the input matching unit 150 changes positively with the voltage difference across the first voltage-controlled capacitor C1. Also, as the output power of the power amplification unit 110 gradually increases, the output voltage of the power detection module 1301 will gradually increase, and the output voltage controls the voltage at a negative end of the first voltage-controlled capacitor C1 in the input matching unit 150, while the voltage at a positive end of the first voltage-controlled capacitor C1 is zero (because the first inductor L1 is grounded). Therefore, the voltage difference across the first voltage-controlled capacitor C1 decreases with the increase of the output power of the power amplification unit 110, the capacitance of the first voltage-controlled capacitor C1 decreases with the increase of the output power of the power amplification unit, and the phase of the radio-frequency signal passing through the input matching unit 150 increases with the increase of the output power of the power amplification unit, i.e. the phase of the radio-frequency signal passing through the input matching unit 150 changes positively with the output power of the power amplification unit. A phase change of the radio-frequency signal passing through the input matching unit 150 is the opposite of a phase change of a radio-frequency signal caused by the power amplification unit 110, and the phase change generated by the power amplification unit 110 can be canceled, so as to make the phase of the radio-frequency signal finally output by the power amplification unit 110 unchanged. As shown in FIG. 6B, when a radio-frequency signal is input into the radio-frequency power amplifier, a phase change of the radio-frequency signal output by the radio-frequency power amplifier approaches zero.

As shown in FIG. 4, the second input matching unit 150 includes at least one second LC matching circuit, an input end of each second LC matching circuit is connected to the output end of the power detection module 1301, and an output end of the last second LC matching circuit is connected to the input end of the power amplification unit 110. Each second LC matching circuit is composed of a second inductor L2 connected in series and a second voltage-controlled capacitor C2 grounded in parallel, and a non-grounded end of the second voltage-controlled capacitor C2 is connected to the output end of the power detection module 1301. And a non-grounded end of the second voltage-controlled capacitor C2 of the last second LC matching circuit is also connected to the input end of the power amplification unit 110. The number of second LC matching circuits is adjusted according to the frequency and bandwidth of a radio-frequency signal.

As shown in FIG. 4, in order to facilitate understanding of the embodiments of the present invention, the input matching unit 150 may include a second LC matching circuit composed of a second inductor L2 connected in series and a second voltage-controlled capacitor C2 grounded in parallel in the same example where the radio-frequency signal has a low frequency and bandwidth. The second voltage-controlled capacitor C2 is implemented using a CMOS process, and has the operating characteristics that the magnitude of capacitance changes according to the voltage difference across the second voltage-controlled capacitor C2, thereby affecting a phase change of a radio-frequency signal passing through the input matching unit 150. The phase change of the radio-frequency signal is the opposite of a phase change of a radio-frequency signal caused by the power amplification unit 110. Therefore, the phase change generated by the power amplification unit 110 can be canceled, so as to make the phase of the radio-frequency signal finally output by the power amplification unit 110 unchanged. Specifically, under a fixed frequency of the radio-frequency signal, (1−K2*C2) is a positive value in formula (2). Therefore, the second voltage-controlled capacitor C2 is increased, and the phase θ of the radio-frequency signal passing through the input matching unit 150 decreases. The second input matching unit 150 makes the phase of the radio-frequency signal finally output by the power amplification unit 110 unchanged in the same process as the first input matching unit 150, and the specific process will not be described in detail herein.

$$\theta = -\arctan\left(\frac{K1}{1 - K2*C2}\right) \quad (2)$$

where θ represents the phase of a radio-frequency signal passing through the input matching unit, K1 and K2 represent scaling coefficients, and C2 represents the second voltage-controlled capacitor.

As shown in FIG. 5, the third input matching unit 150 includes at least one first LC matching circuit and at least one second LC matching circuit. Input ends of each first LC matching circuit and each second LC matching circuit are connected to the output end of the power detection module 1301 respectively, and output ends of the last first LC matching circuit and the last second LC matching circuit are connected to the input end of the power amplification unit 110 respectively. The structures of the first LC matching circuit and the second LC matching circuit and the connection relationship with the power detection module 1301 and the power amplification unit 110 are as described above, the third input matching unit makes the phase of the radio-frequency signal finally output by the power amplification unit 110 unchanged through the first LC matching circuit and the second LC matching circuit in the same process as the first input matching unit 150, and the specific process will not be described in detail herein.

Figure 7:
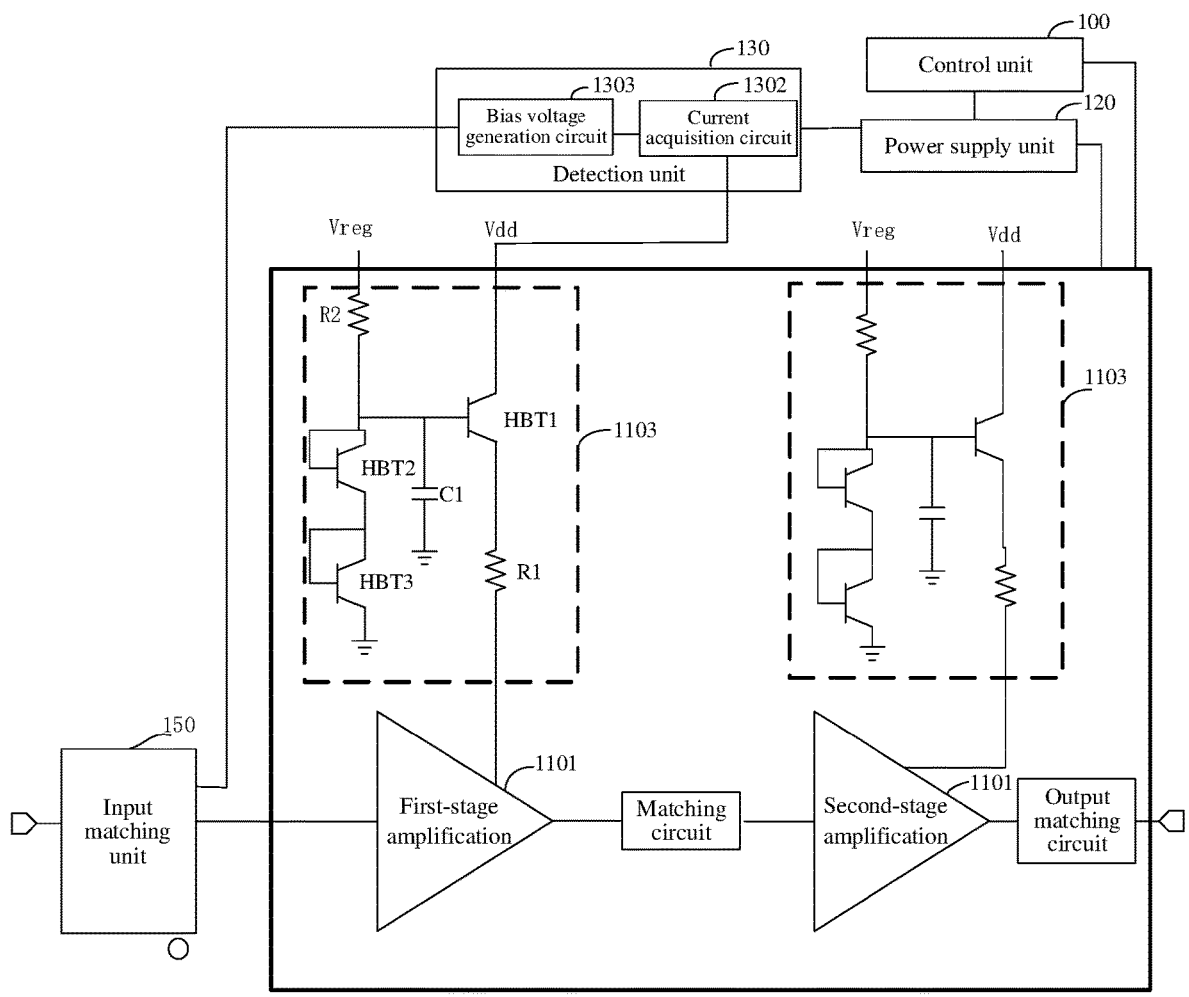
FIG. 7 is a schematic structural diagram of a second detection unit in a radio-frequency power amplifier according to the present invention.

As shown in FIG. 7, in another embodiment of the present invention, the detection unit 130 uses a current acquisition circuit 1302 and a bias voltage generation circuit 1303. An input end of the current acquisition circuit 1302 is connected to a collector of a first transistor HBT1 of a bias circuit which is connected to a certain stage of amplification circuit. An output end of the current acquisition circuit 1302 is connected to an input end of the bias voltage generation circuit 1303. An output end of the bias voltage generation circuit 1303 is connected to the input end of the input matching unit 150, i.e. the output end of the bias voltage generation circuit 1303 is connected to the non-grounded end of the first voltage-controlled capacitor C1 and/or the second voltage-controlled capacitor C2 of the input matching unit 150. An operating current of the power amplification unit 110 is acquired in real time by the current acquisition circuit 1302, input into the bias voltage generation circuit 1303, and converted into a direct current voltage positively correlated to the magnitude of the operating current. The current detection circuit 1302 and the bias voltage generation circuit 1303 may be implemented using conventional circuits, and will not be described in detail herein.

Figure 8:
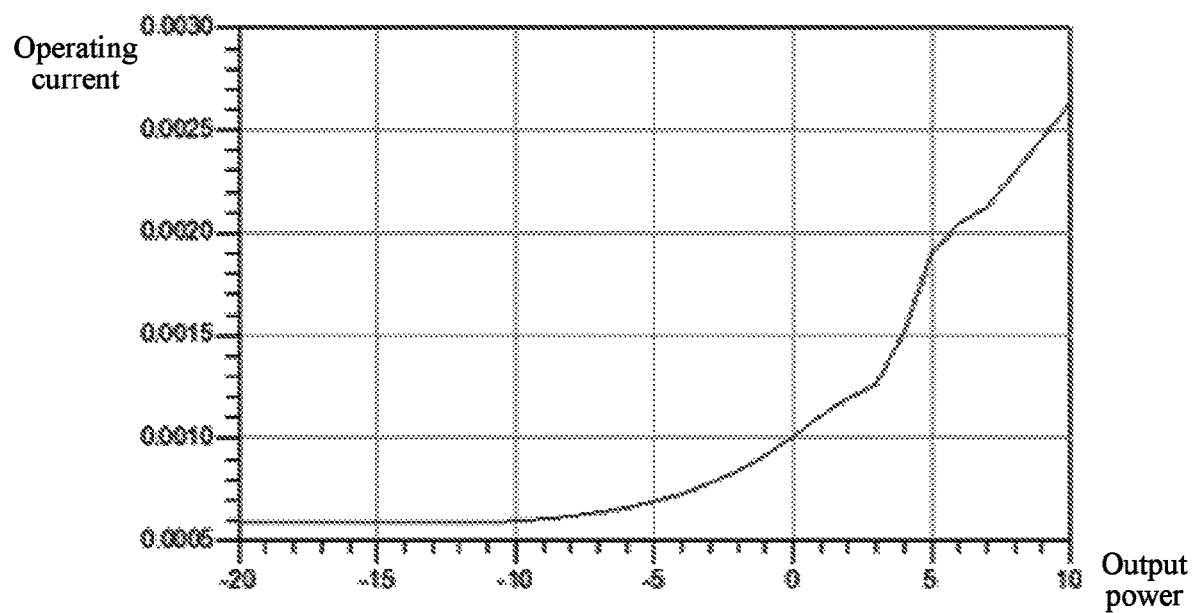
FIG. 8 is a schematic diagram of a change curve of current acquired by a second detection unit with the output power of a power amplification unit in a radio-frequency power amplifier according to the present invention.
Figure 9:
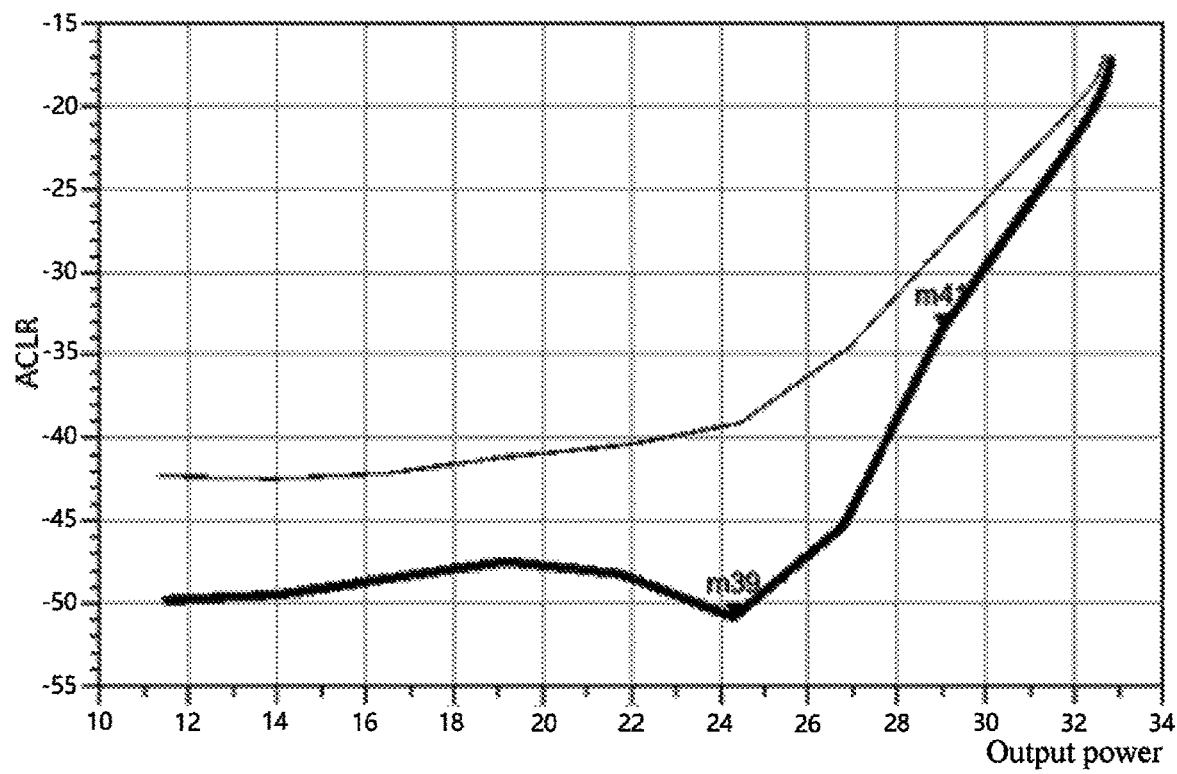
FIG. 9 is a schematic comparison diagram of a change curve of ACPR with the output power when a radio-frequency power amplifier according to the present invention is used and not used.

Specifically, the operating current on the first transistor HBT1 of the bias circuit to which any stage of amplification circuit is connected in the power amplification unit 110 will increase as the output power of the power amplification unit 110 increases. As shown in FIG. 8, the current detection circuit 1302 detects an operating current on the first transistor HBT1, and converts the operating current into a direct current voltage positively correlated to the magnitude of the operating current through the bias voltage generation circuit 1303. Therefore, as the output power of the power amplification unit 110 increases, the direct current voltage output by the bias voltage generation circuit 1303 also increases, and the output direct current voltage is input into the input matching unit 150, such that the phase of the radio-frequency signal passing through the input matching unit 150 changes positively or negatively with the output power of the power amplification unit. By changing the polarity of the corresponding voltage-controlled capacitor, the phase change of the radio-frequency signal of the input matching unit 150 is the opposite of a phase change of a radio-frequency signal caused by the power amplification unit 110, and the phase change generated by the power amplification unit 110 can be canceled, so as to make the phase of the radio-frequency signal finally output by the power amplification unit 110 unchanged, thereby ensuring the optimal linearity of the radio-frequency front-end module. As shown in FIG. 9, ACPR is an index describing the linearity of the radio-frequency power amplifier. The smaller ACPR indicates the better linearity of the radio-frequency power amplifier. In FIG. 9, a thicker curve shows that as the output power of the radio-frequency power amplifier increases in the presence of the radio-frequency power amplifier, the linearity is significantly higher than the linearity shown by a thinner curve in the absence of the radio-frequency power amplifier. The input matching unit 150 makes the phase of the radio-frequency signal finally output by the power amplification unit 110 unchanged in the same process as described above, and the specific process will not be described in detail herein.

In the radio-frequency power amplifier provided by the present invention, the control unit changes a function relationship between the output power of the power amplification unit and the output voltage of the detection unit in different frequency bands and different power level modes, and the detection unit converts the detected output power or operating current of the power amplification unit into a corresponding voltage, and then inputs the voltage into the input matching unit, such that a phase change of a radio-frequency signal input into the power amplification unit is the opposite of a phase change generated by an output signal of the power amplification unit, and the phase of a radio-frequency signal finally output by the power amplification unit is unchanged, thereby realizing the compensation of phase distortion of radio-frequency signals output by the power amplification unit in different modes, and improving a linearity index of the radio-frequency front-end module.

The radio-frequency power amplifier provided by the present invention may be applied in a radio-frequency front-end module. The radio-frequency front-end module includes, but is not limited to, a Wifi radio-frequency front-end module and a multi-mode multi-frequency radio-frequency front-end module.

Figure 10:
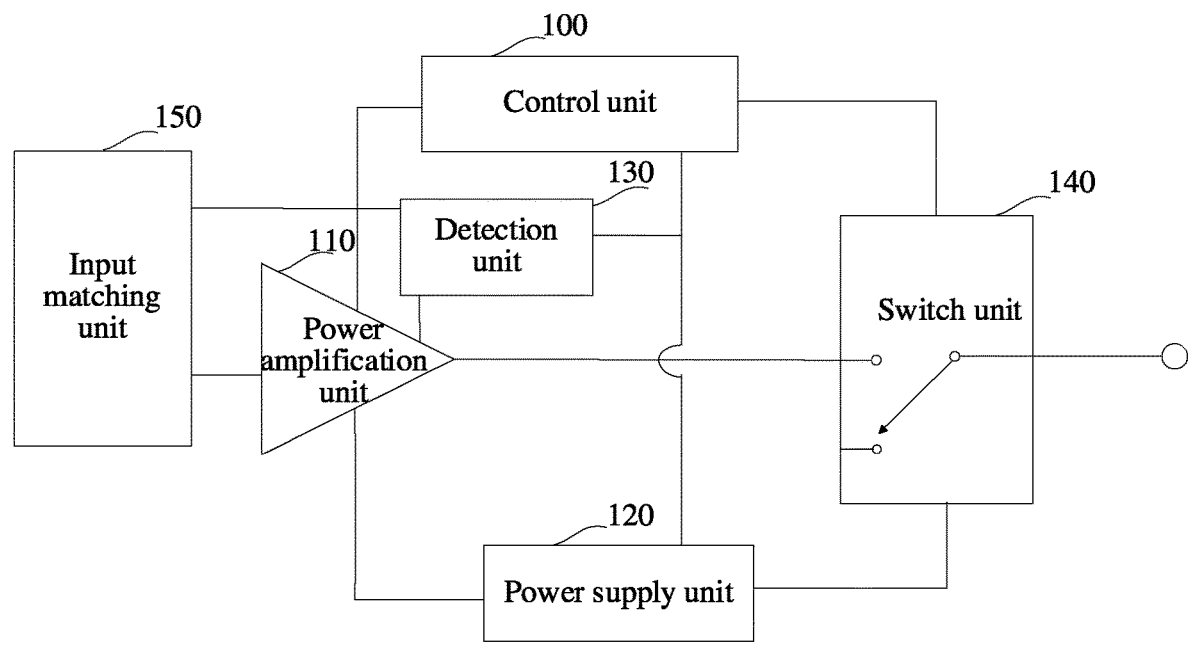
FIG. 10 is a schematic structural diagram of a radio-frequency front-end module according to the present invention.

As shown in FIG. 10, the radio-frequency front-end module may further include a switch unit 140 in addition to the radio-frequency power amplifier. The switch unit 140 is connected to the control unit 100, the power supply unit 120 and the power amplification unit 110 of the radio-frequency power amplifier respectively. A radio-frequency signal amplified by the radio-frequency power amplifier is transmitted to an antenna by the switch unit 140, and transmitted to a base station by the antenna, whereby the radio-frequency front-end module transmits the radio-frequency signal to the base station. The switch unit 140 may be implemented using a single-pole multi-throw switch or a multi-pole multi-throw switch.

Figure 11:
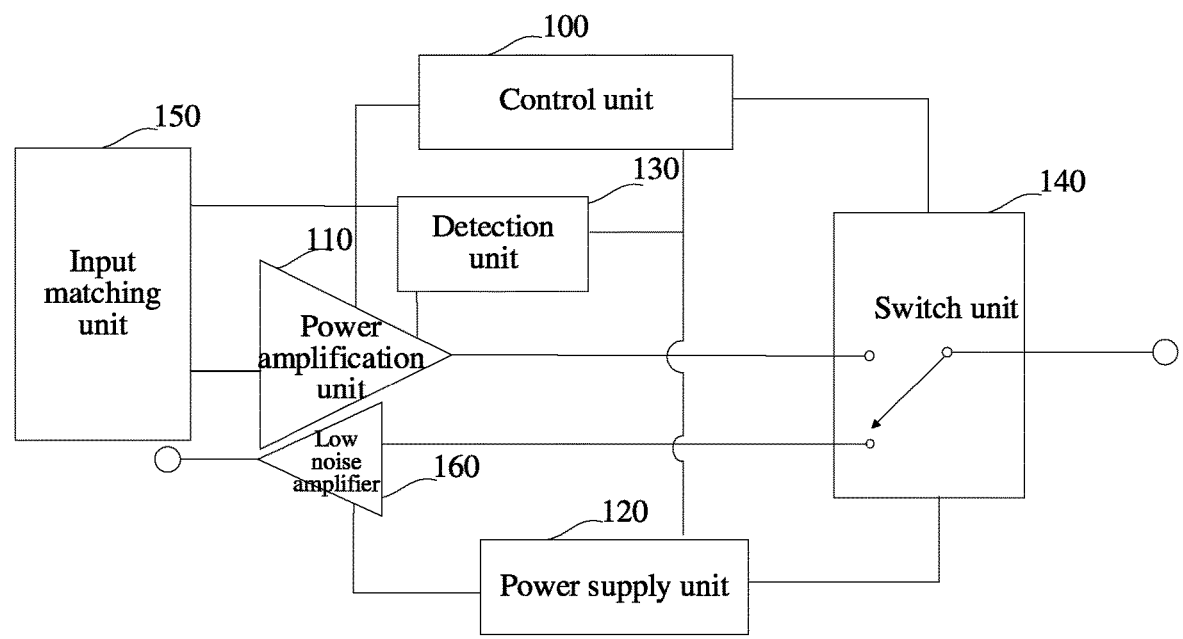
FIG. 11 is another schematic structural diagram of a radio-frequency front-end module according to the present invention.

When it is required to achieve bidirectional transmission of the radio-frequency signal between the radio-frequency front-end module and the base station, as shown in FIG. 11, a low noise amplifier 160 may also be disposed in the radio-frequency front-end module. The low noise amplifier 160 is connected to the switch unit 140. The radio-frequency signal transmitted from the base station is power-amplified by the low noise amplifier 160 and then transmitted to a transceiver for demodulation.

The radio-frequency front-end module provided by the present invention may be used in a radio-frequency chip. The specific structure of a radio-frequency power amplifier in the radio-frequency chip is not described in detail herein.

In addition, the above-mentioned radio-frequency power amplifier/radio-frequency front-end module may also be used in a communication terminal as an important component of a radio-frequency circuit. As used herein, the communication terminal refers to a computer device that may be used in a mobile environment to support various communication standards such as GSM, EDGE, TD_SCDMA, TDD_LTE, or FDD_LTE, including but not limited to a mobile phone, a notebook computer, a tablet computer, an on-board computer, etc. In addition, the radio-frequency power amplifier is also suitable for use in other communication technology applications, such as communication base stations compatible with a variety of communication standards, which are not described in detail herein.

The radio-frequency power amplifier, the radio-frequency front-end module, and the communication terminal provided in the present invention are described above in detail. For those of ordinary skill in the art, any obvious change made to the present invention without departing from the essential content of the present invention shall fall within the protection scope of the patent of the present invention.

What is claimed is:

1. A radio-frequency power amplifier comprising a power amplification unit, a detection unit and an input matching unit, wherein an output end of the power amplification unit is connected to an input end of the detection unit, an output end of the detection unit is connected to an input end of the input matching unit, and an output, end of the input matching unit is connected to an input end of the power amplification unit;

the detection unit detects an index parameter related to the output power of the power amplification unit in real time, converts the index parameter into a voltage positively correlated to the magnitude of the index parameter, and outputs the voltage to the input matching unit, such that a phase change of a radio-frequency signal input into the power amplification unit is the opposite of a phase change generated by an output signal of the power amplification unit.

2. A radio-frequency power amplifier comprising a power amplification unit, a detection unit and an input matching unit, wherein a bias end of the power amplification unit is connected to an input end of the detection unit, an output end of the detection unit is connected to an input end of the input matching unit, and an output end of the input matching unit is connected to an input end of the power amplification unit;

the detection unit detects an index parameter related to the output power of the power amplification unit in real time, converts the index parameter into a voltage positively correlated to the magnitude of the index parameter, and outputs the voltage to the input matching unit, such that a phase change of a radio-frequency signal input into the power amplification unit is the opposite of a phase change generated by an output signal of the power amplification unit.

3. The radio-frequency power amplifier according to claim 1, wherein
the index parameter is the output power or operating current of the power amplification unit.

4. The radio-frequency power amplifier according to claim 1, further comprising a control unit and a power supply unit, wherein an output end of the control unit is connected to the input end of the power amplification unit and an input end of the power supply unit respectively, and an output end of the power supply unit is connected to power supply ends of the power amplification unit and the detection unit respectively.

5. The radio-frequency power amplifier according to claim 1, wherein
the power amplification unit comprises at least one stage of amplification circuit, each stage of amplification circuit is connected to a bias circuit respectively, and an output end of a certain stage of amplification circuit is connected to the input end of the power detection unit.

6. The radio-frequency power amplifier according to claim 5, wherein
if the power amplification unit comprises two or more stages of amplification circuits, the various stages of amplification circuits are connected through an inter-stage matching circuit, an input end of the first stage of amplification circuit is connected to the output end of the input matching unit, and the last stage of amplification circuit is impedance-matched with an external antenna through an output matching circuit.

7. The radio-frequency power amplifier according to claim 5, wherein
the detection unit uses a power detection module, an input end of the power detection module is connected to an output end of a certain stage of amplification circuit of the power amplification unit, and an output end of the power detection module is connected to the input end of the input matching unit.

8. The radio-frequency power amplifier according to claim 5, wherein
the detection unit uses a current acquisition circuit and a bias voltage generation circuit, an input end of the current acquisition circuit is connected to a bias circuit connected to a certain stage of amplification circuit, an output end of the current acquisition circuit is connected to an input end of the bias voltage generation circuit, and an output end of the bias voltage generation circuit is connected to the input end of the input matching unit.

9. The radio-frequency power amplifier according to claim 1, wherein
the input matching unit comprises at least one first LC matching circuit, an input end of each of the first LC matching circuits is connected to the output end of the detection unit, and an output end of the last first LC matching circuit is connected to the input end of the power amplification unit.

10. The radio-frequency power amplifier according to claim 1, wherein
the input matching unit comprises at least one second LC matching circuit, an input end of each of the second LC matching circuits is connected to the output end of the detection unit, and an output end of the last second LC matching circuit is connected to the input end of the power amplification unit.

11. The radio-frequency power amplifier according to claim 1, wherein
the input matching unit comprises at least one first LC matching circuit and at least one second LC matching circuit, input ends of each of the first LC matching circuits and each of the second LC matching circuits are connected to the output end of the detection unit respectively, and output ends of the last first LC matching circuit and the last second LC matching circuit are connected to the input end of the power amplification unit respectively.

12. The radio-frequency power amplifier according to claim 9, wherein
each of the first LC matching circuits is composed of a first inductor grounded in parallel and a first voltage-controlled capacitor connected in series, a non-grounded end of the first voltage-controlled capacitor is connected to the output end of the detection unit, and a non-grounded end of the first voltage-controlled capacitor of the last first, LC matching circuit is also connected to the input end of the power amplification unit.

13. The radio-frequency power amplifier according to claim 10, wherein
each of the second LC matching circuits is composed of a second inductor connected in series and a second voltage-controlled capacitor grounded in parallel, a non-grounded end of the second voltage-controlled capacitor is connected to the output end of the detection unit, and a non-grounded end of the second voltage-controlled capacitor of the last second LC matching circuit is also connected to the input end of the power amplification unit.

14. A radio-frequency front-end module comprising the radio-frequency power amplifier according to claim 1.

15. The radio-frequency power amplifier according to claim 2, wherein the index parameter is the output power or operating current of the power amplification unit.

16. The radio-frequency power amplifier according to claim 2, further comprising a control unit and a power supply unit, wherein an output end of the control unit is connected to the input end of the power amplification unit and an input end of the power supply unit respectively, and an output end of the power supply unit is connected to power supply ends of the power amplification unit and the detection unit respectively.

17. The radio-frequency power amplifier according to claim 2, wherein the power amplification unit comprises at least one stage of amplification circuit, each stage of amplification circuit is connected to a bias circuit respectively, and an output end of a certain stage of amplification circuit is connected to the input end of the power detection unit.

18. The radio-frequency power amplifier according to claim 2, wherein the input matching unit comprises at least one first LC matching circuit, an input end of each of the first LC matching circuits is connected to the output end of the detection unit, and an output end of the last first LC matching circuit is connected to the input end of the power amplification unit.

19. The radio-frequency power amplifier according to claim 2, wherein the input matching unit comprises at least one second LC matching circuit, an input end of each of the second LC matching circuits is connected to the output end of the detection unit, and an output end of the last second LC matching circuit is connected to the input end of the power amplification unit.

20. The radio-frequency power amplifier according to claim 2, wherein the input matching unit comprises at least one first LC matching circuit and at least one second LC matching circuit, input ends of each of the first LC matching circuits and each of the second LC matching circuits are connected to the output end of the detection unit respectively, and output ends of the last first LC matching circuit and the last second LC matching circuit are connected to the input end of the power amplification unit respectively.

* * * * *